(12) United States Patent
Olson

(10) Patent No.: US 6,316,933 B1
(45) Date of Patent: Nov. 13, 2001

(54) TEST BUS CIRCUIT AND ASSOCIATED METHOD

(75) Inventor: Erlend Olson, Duarte, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 09/384,711

(22) Filed: Aug. 26, 1999

(51) Int. Cl.$^7$ ........................................ G01R 1/04

(52) U.S. Cl. ................................................ 324/158.1

(58) Field of Search .................. 324/158.1; 327/362, 327/379, 382, 383

(56) References Cited

U.S. PATENT DOCUMENTS

| | | | |
|---|---|---|---|
| 5,371,457 | * 12/1994 | Lipp | 324/158.1 |
| 5,404,358 | 4/1995 | Russell . | |
| 5,506,851 | 4/1996 | Fuse . | |
| 5,563,526 | 10/1996 | Hastings et al. . | |
| 5,568,493 | 10/1996 | Morris . | |
| 5,577,052 | 11/1996 | Morris . | |
| 5,610,530 | 3/1997 | Whetsel . | |
| 5,610,826 | 3/1997 | Whetsel . | |
| 5,646,521 | 7/1997 | Rosenthal et al. . | |
| 5,659,257 | 8/1997 | Lu et al. . | |
| 5,744,949 | * 4/1998 | Whetsel | 324/158.1 |
| 5,781,559 | 7/1998 | Muris et al. . | |
| 5,828,824 | 10/1998 | Swoboda . | |
| 5,872,908 | 2/1999 | Whetsel . | |
| 6,005,433 | * 12/1999 | Hale | 327/379 |

OTHER PUBLICATIONS

P1149.4/D25 Draft Standard for a Mixed–Signal Test Bus, IEEE Standards Department, 1999.

Agrawal, Vishwani D., Design of mixed–signal systems for testabiliby, Integration, the VLSI journal 26(1998) pp. 141–150.

Novellino, John, Standards Group Making Progress On Mixed–Signal Test Bus Standard, Electronic Design, May 278, 1993.

(List continued on next page.)

*Primary Examiner*—Safet Metjahic
*Assistant Examiner*—E P LeRoux
(74) *Attorney, Agent, or Firm*—Christie, Parker & Hale, LLP

(57) ABSTRACT

An on-chip test bus circuit for testing a plurality of circuits and an associated method. The test bus circuit consists of a test bus and a plurality of switching circuits which selectably provide electrical connections between the respective circuits and the test bus. The plurality of switching circuits are configured to transfer an electrical charge between a node disposed within each switching circuit not selected to provide an electrical connection and a respective charge source or sink. The charge source or sink may consist of a low-impedance, substantially noise-free DC voltage or signal source. The associated method of the present invention consists of the following steps: (1) providing a test bus; (2) providing a plurality of switching circuits for selectively providing electrical connections between the respective circuits and the test bus; (3) providing one or more charge sources or sinks coupled to the respective switching circuits; (4) setting the respective switching circuit associated with a selected one of the circuits to a conducting state; (5) setting the one or more respective switching circuits associated with the one or more unselected circuits to a non-conducting state; (6) transmitting a test signal between the selected circuit and the test bus via the switching circuit in the conducting state; and (7) transferring an electrical charge between a node disposed within each of the one or more switching circuits in the non-conducting state and the respective charge source or sink. The test bus circuit and associated method are especially suitable for use with high-speed analog or mixed-signal integrated circuits.

54 Claims, 4 Drawing Sheets

OTHER PUBLICATIONS

Sunter, S.K., Cost/benefit analysis of the P1149.4 mixed–signal test bus, IEEE Proc.–Circuits Devices Syst. vol. 143 No. 6 (Dec. 1996).

Roberts, Gordon W., Improving The Testability Of Mixed Mixed–Signal Integrated, Circuits, Proceedings of the IEEE 1997 Custom Integrated Circuit Conference, May 5–8, 1997.

A New Method for Testing Mixed Analog and Digital Circuits, IEEE, Proceedings of The Fourth Asian Test Symposium, Nov. 23–24, 1995.

Osseiran, Adam, Getting To A Test Standard For Mixed–Signal Boards, 38th Midwest Symposium on Circuits and Systems Proceedings vol. 2, Aug. 13–15, 1995.

* cited by examiner

TEST BUS CIRCUIT AND ASSOCIATED METHOD

TECHNICAL FIELD

This invention relates generally to the testing of analog or mixed-signal integrated circuits and, in particular, to a test bus circuit suitable for testing multiple high-speed analog circuits disposed on a common substrate.

BACKGROUND OF THE INVENTION

The observation and control of signals in integrated circuits is necessary for the manufacturing testing and diagnosis of the integrated circuits. However, modern digital, analog and mixed-signal integrated circuits, which comprise of hundreds of thousands or even millions of interconnected circuit elements disposed on a common semiconductor substrate, are often difficult to test because the signals inside the integrated circuits are not directly observable and controllable. For digital circuits, many techniques have been developed that address this problem including scan-path design and the IEEE 1149.1 (commonly known as JTAG) standard. These techniques typically employ scan registers or other dedicated logic such that the storage elements in a digital circuit can be used as direct observation and control points, independent of their proximity to the functional interface of the circuit.

Digital circuits benefit from the fact that digital signals can be observed, controlled and brought in proximity to each other through multiplexing or other combinatorial operations with little or no effect on their normal intended function. This is because coupling mechanisms (principally capacitive and conductive) that are common to all proximate signals on a chip are of such a magnitude that they have little deleterious effect on digital signals. As a result, digital circuits can be accurately tested using these techniques without affecting the normal operation of the circuit in any appreciable way.

For analog or mixed-signal integrated circuits, there is also a strong need to observe and control signals for testing and diagnosis. Since the analog signals generated by these integrated circuits include both voltage and frequency (or time-dependent) information, however, it is necessary to stimulate or analyze the complete full-bandwidth properties of the signals. A parametric analysis of the properties and integrity of the analog signals is often critical to understanding the functioning of the analog or mixed-signal integrated circuit. This is very different from digital signal analysis, which usually consists of a simple static analysis of logical signal values.

Analog signals, especially in communications and other high-speed applications, do not have the same immunity from degradation as digital signals because they are typically subject to very stringent signal integrity requirements. Consequently, analog signals are often specially routed and shielded in circuit design and construction to avoid coupling mechanisms to other nearby analog or digital circuits or signals, or to signals of such a nature as to cause destructive interference regardless of their proximity.

For the above-mentioned reasons, conventional scan techniques that are used to test digital circuits cannot be used to test analog or mixed-signal integrated circuits. For example, if simple multiplexing transistors and scan circuits are used to transmit multiple analog signals between external observation or control points and analog circuits under test, an unacceptable level of degradation in one or more critical signal properties would typically occur. The signal degradation is primarily caused by the capacitive coupling between the multiplexing transistors and between the analog signals that are brought to the multiplexing point. In earlier integrated circuit designs, such degradation was often acceptable. However, with the recent advent of integrated circuits capable of very-high rate analog signal processing, made possible by the development of deep sub-micron circuit technologies, this level of degradation cannot be tolerated.

Conventional scan techniques are unsuitable for testing analog or mixed-signal integrated circuits also because they require signals to be stored for observation or read-out at a later time. However, analog signals are usually not static, so they cannot be readily or inexpensively stored. Furthermore, the storage of a signal implies that a non-real-time analysis of the properties or logical functioning of the signal is useful. Since most important properties of analog signals in modem analog or mixed-signal integrated circuits must be observed in real-time, however, conventional scan techniques cannot be used.

To preserve their integrity, analog signals may be observed or controlled directly through the pins of the integrated circuit package. To implement directly observable and controllable points in an integrated circuit, it is generally required that multiple test pins be added to the package of the integrated circuit. However, the additional pins significantly increase the cost of the integrated circuit because the cost of the integrated circuit package, which is typically greater than the cost of the silicon chip itself, is principally determined by the pin count.

The integrity of analog signals can also be preserved by placing a shield around the conductors on the integrated circuit. A shield electrically isolates a signal transmitted on a conductor from interfering electric fields. Shields are commonly used in the manufacture of non-integrated electronics and coaxial cables. Shielding signals on modern integrated circuits, however, is problematic because the shield must be placed very close to the conductor being shielded and thus often presents an unacceptably large capacitive load on the conductor.

The useful observation and control of analog signals for the purpose of manufacturing testing and diagnosis sometimes requires that other analog circuits on the integrated circuit function during testing. As mentioned earlier, however, conventional scan techniques typically suffer from crosstalk such that the testing of an analog circuit may interfere with the normal operation of nearby or related circuits.

The above-described limitations on the observation and control of analog signals exist in stark contrast to the scan methodology used in the digital world, where a circuit often can be transformed from a functional mode to a test mode at will to facilitate the use of the scan path registers.

In view of the shortcomings of the earlier approaches to testing analog or mixed-signal integrated circuits, it is an object of the present invention to maintain a high level of signal integrity and observation or stimulation bandwidth when observing or controlling signals in analog or mixed-signal integrated circuits.

Another object of the invention is to observe or control signals in analog or mixed-signal integrated circuits without interfering with the normal operation of nearby or related circuits.

A further object of the invention is to minimize the number of pins necessary to observe or control signals in analog or mixed-signal integrated circuits.

SUMMARY OF THE INVENTION

The present invention consists of an on-chip test bus circuit for testing a plurality of circuits and an associated method. The test bus circuit comprises a test bus and a plurality of switching circuits which selectably provide electrical connections between the respective circuits and the test bus. The plurality of switching circuits are configured to transfer an electrical charge between a node disposed within each switching circuit not selected to provide an electrical connection and a respective charge source or sink. The charge source or sink may consist of a low-impedance DC voltage or signal source.

The associated method of the present invention consists of the following steps: (1) providing a test bus; (2) providing a plurality of switching circuits for selectively providing electrical connections between the respective circuits and the test bus; (3) providing one or more charge sources or sinks coupled to the respective switching circuits; (4) setting the respective switching circuit associated with a selected one of the circuits to the conducting state; (5) setting the one or more respective switching circuits associated with the one or more unselected circuits to the non-conducting state; (6) transmitting a test signal between the selected circuit and the test bus via the switching circuit in the conducting state; and (7) transferring an electrical charge between a node disposed within each of the one or more switching circuits in the non-conducting state and the respective charge source or sink.

Some advantages of the test bus circuit and the associated method over earlier testing approaches are as follows. First, the test bus circuit provides a high level of signal integrity and bandwidth for signals to be observed or controlled on an integrated circuit due to its relatively simple and short circuit path. Second, the test bus circuit provides a high level of electrical isolation due to its combined use of multiple, serially-coupled selection devices and the charge-transferring circuit. As a result, signals can be observed and controlled without interfering with the normal operation of nearby or related circuits on the integrated circuit. Third, the test bus circuit minimizes the number of pins necessary for the integrated circuit package to observe or control the signals. Fourth, the test bus circuit is relatively simple to implement and does not significantly increase the size or complexity of the integrated circuit. Fifth, if the test bus circuit includes an optional driven shield, the test bus circuit provides a reduced level of interference with the operation of the circuitry being tested. For these reasons, the test bus circuit is especially suitable for use with high-speed analog or mixed-signal integrated circuits.

These and other features and advantages of the invention will be better appreciated from the following detailed description of the invention together with the appended drawings.

DETAILED DESCRIPTION OF THE PREFERRED EMBODIMENTS

The present invention comprises a novel test bus circuit for use in highly integrated electronic systems such as analog or mixed-signal integrated circuits. The test bus circuit is especially suitable for the careful examination or stimulation of internal analog signals that are not otherwise directly observable or controllable from the functional interface of the system. The following description is presented to enable any person skilled in the art to make and use the invention, and is provided in the context of a particular application and its requirements. Various modifications to the preferred embodiment will be readily apparent to those skilled in the art, and the generic principles defined herein may be applied to other embodiments and applications without departing from the spirit and scope of the invention. Moreover, in the following description, numerous details are set forth for purpose of explanation. However, one of ordinary skill in the art would realize that the invention may be practiced without the use of these specific details. In other instances, well-known structures and devices are shown in block diagram form in order not to obscure the description of the invention with unnecessary detail. Thus, the present invention is not intended to be limited to the embodiment shown, but is to be accorded the widest scope consistent with the principles and features disclosed herein.

Figure 1:
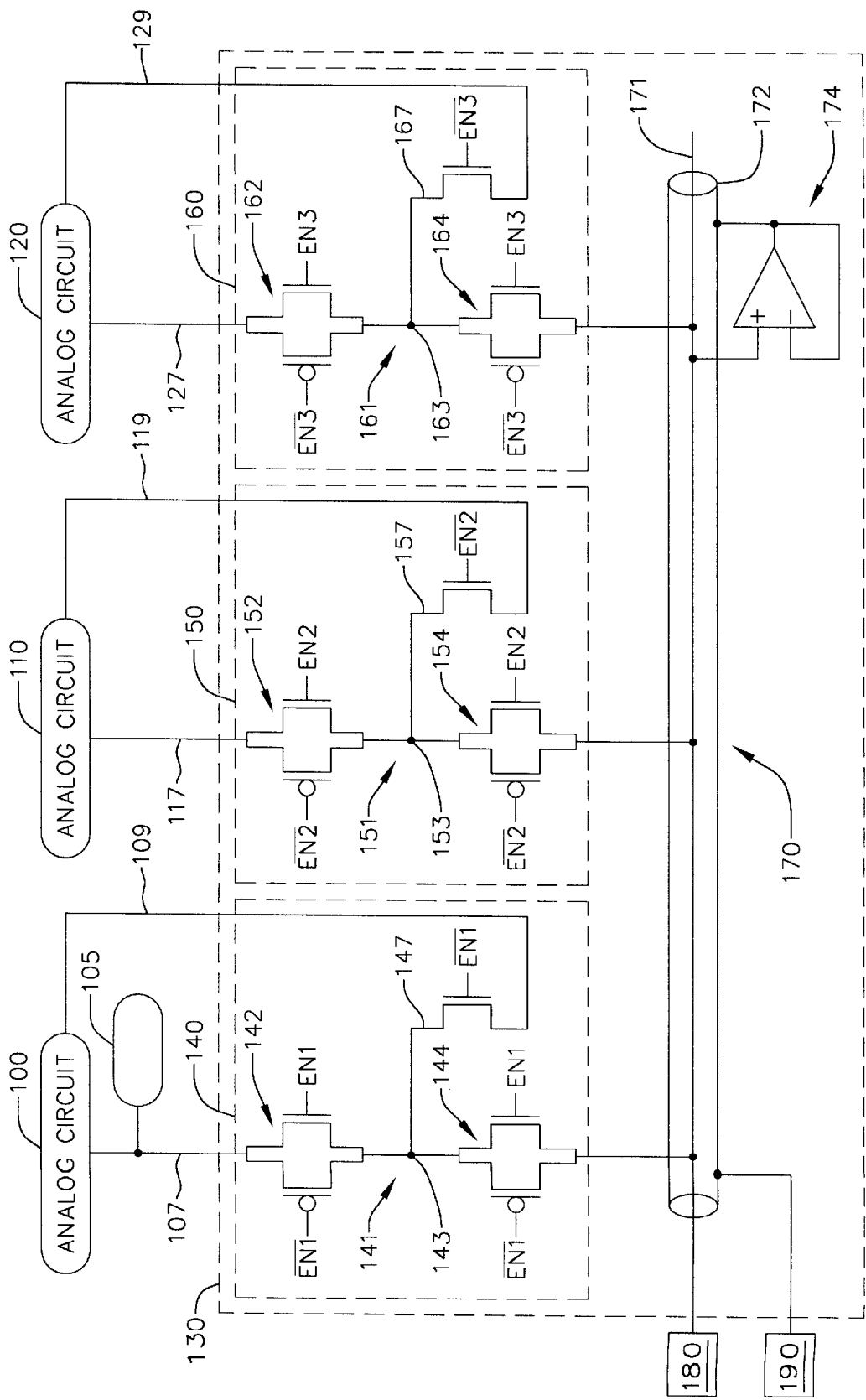
FIG. 1 is a circuit diagram of a test bus circuit in accordance with a first preferred embodiment of the present invention including a driven shield.

FIG. 1 is a circuit diagram of a test bus circuit 130 in accordance with a first preferred embodiment of the present invention. The test bus circuit 130 selectively effects electrical connections between multiple analog circuits 100, 110 and 120 and a test bus observe/control point 180 so that analog signals in the circuits can be observed or controlled. The test bus observe/control point 180 is used to transmit analog test signals to and from the analog circuits 100, 110 and 120. The analog circuits 100, 110 and 120, the test bus circuit 130 and the test bus observe/control point 180 are all disposed on a common substrate. In a preferred embodiment, the test bus circuit 130 is implemented on an analog or mixed-signal integrated circuit, where the test bus observe/control point 180 is an integrated circuit package pin and the substrate is composed of a semiconducting material such as silicon.

The test bus circuit 130 comprises a test bus 170 and one or more switching circuits 140, 150 and 160. The test bus 170 connects the switching circuits 140, 150 and 160 to the test bus observe/control point 180. The test bus 170 comprises a test bus conductor 171 and an optional shield 172, which will be described in more detail below. The switching circuits 140, 150 and 160 selectively connect the analog circuits 100, 110 and 120, respectively, to the test bus 170 so that a signal in one of the analog circuits can be observed or controlled. The switching circuits 140, 150 and 160 are operatively connected to the respective analog signal lines 107, 117 and 127 in the analog circuits 100, 110 and 120. The analog signal lines 107, 117 and 127 may be internal to the analog circuits or alternatively, may connect to another functional block (e.g., block 105). In the embodiment of the invention shown, the analog signal lines 107, 117 and 127 transmit a single, digital (i.e., non-differential) signal. In other embodiments described later, the analog signal lines 107, 117 and 127 transmit fully differential signals.

The switching circuits 140, 150 and 160 are identical in structure and operation and thus will be described using the switching circuit 140 as an example. The switching circuit 140 comprises two or more serially-coupled selection devices 142 and 144 and a charge-transferring circuit 147. The selection devices 142 and 144 are serially coupled in that their drain or source terminals are operatively connected at a node 143. A first portion or end of the serially-coupled selection devices 142 and 144 is operatively connected to the test bus 170 while a second portion or end is operatively connected to the signal 107 of the analog circuit 100. In a preferred embodiment, the selection devices 142 and 144 are each composed of a p-type and an n-type transistor operatively connected in parallel (i.e., a CMOS pass device). The selection devices 142 and 144 are sized to the minimum size consistent with the impedance of the signal 107 to be observed or controlled in the analog circuit 100. For the observation function, it is usually desirable for the test bus 170 to have a high impedance and thus the selection devices 142 and 144 should be small in size. For the control function, however, it is typically preferred that the test bus 170 have a low impedance and the selection devices be larger in size. Techniques for determining the optimum size for the selection devices 142 and 144 are well-known in the art and will not be discussed further here.

The charge-transferring circuit 147 is operatively connected at one end (e.g., the drain terminal) to the node 143 located between the serially-coupled selection devices 142 and 144. The other end (e.g., the source terminal) of the charge-transferring circuit 147 is operatively connected to a low-impedance signal line 109 originating from the analog circuit 100 or an external circuit (not shown). The signal transmitted by the signal line 109 is substantially noise-free and is generated by a charge source or sink (not shown). The charge source or sink may be a low-impedance DC voltage source (e.g., ground) or reference signal source disposed in the analog circuit 100 or the external circuit. The impedance of the signal line 109 should be relatively low as compared to the impedance of the analog signal line 107. The charge-transferring circuit 147 transfers electrical charge between the node 143 and the DC voltage or reference signal source, thereby discharging any electrical charge that may accumulate at the node 143. Consequently, the charge-transferring circuit 147 improves the electrical isolation provided by the switching circuit 140 when it is disabled between the analog signal line 107 and the test bus 170. The charge-transferring circuit 147 may comprise a p- or n-type transistor, a CMOS pass device or a plurality of serially-coupled transistors. The charge-transferring circuit 147 is sized to the minimum size consistent with a low-impedance connection to the node 143.

The gate terminals of the transistors in the selection devices 142 and 144 and the charge-transferring circuit 147 receive the control signals EN1/$\overline{EN1}$ as shown in FIG. 1. Similarly, the gate terminals of the transistors in the selection devices and charge-transferring circuits of the switching circuits 150 and 160 receive the control signals EN2/$\overline{EN2}$ and EN3/$\overline{EN3}$, respectively. The control signals EN1/$\overline{EN1}$, EN2/$\overline{EN2}$ and EN3/$\overline{EN3}$ are generated by a control circuit (not shown) in the test bus circuit 130. The control signals are used to set the corresponding selection devices and the charge-transferring circuits to a conducting or non-conducting state so as to selectively effect an electrical connection between the analog circuits 100, 110 and 120 and the test bus 170.

The test bus circuit 130 operates as follows. When the observation or control of the signal line 107 in the analog circuit 100 is desired, the selection devices 142 and 144 are set to an on or conducting state and the charge-transferring circuit 147 is set to an off or non-conducting state to create an electrical connection between the analog circuit 100 and the test bus 170. At about the same time, the selection devices 152, 154, 162 and 164 are set to the non-conducting state and the charge-transferring circuits 157 and 167 are set to the conducting state to electrically isolate the analog circuits 110 and 120 from the test bus 170. The selection devices and charge-transferring circuits in the test bus circuit 130 are set to the conducting or non-conducting state using the control signals EN1/$\overline{EN1}$, EN2/$\overline{EN2}$ and EN3/$\overline{EN3}$. Similarly, when the observation or control of the signal line 117 in the analog circuit 110 is desired, the selection devices 152 and 154 are set to the conducting state, the charge-transferring circuit 157 is set to the non-conducting state, the selection devices 142, 144, 162 and 164 are set to the non-conducting state and the charge-transferring circuits 147 and 167 are set to the conducting state. Likewise, when the observation or control of the signal line 127 in the analog circuit 120 is desired, the selection devices 162 and 164 are set to the conducting state, the charge-transferring circuit 167 is set to the non-conducting state, the selection devices 142, 144, 152 and 154 are set to the non-conducting state and the charge-transferring circuits 147 and 157 are set to the conducting state.

Table 1 shows the logic values required for the control signals EN1/$\overline{EN1}$, EN2/$\overline{EN2}$ and EN3/$\overline{EN3}$ to observe or control the signal lines 107, 117 and 127.

TABLE 1

| Function of test bus circuit 130 | Control Signal Logic Values | | |
|---|---|---|---|
| | EN1/$\overline{EN1}$ | EN2/$\overline{EN2}$ | EN3/$\overline{EN3}$ |
| Observe/control signal line 107 | 1/0 | 0/1 | 0/1 |
| Observe/control signal line 117 | 0/1 | 1/0 | 0/1 |
| Observe/control signal line 127 | 0/1 | 0/1 | 1/0 |

When disabled, the switching circuits 140, 150 and 160 provide a high level of electrical isolation between the analog signal lines 107, 117 and 127 and the test bus 170. This level of isolation is achieved, using the switching circuit 140 as an example, with the two selection devices 142 and 144 operatively connected in series in combination with the charge-transferring circuit 147. When in the non-conducting state, the selection devices 142 and 144 create a very high DC and low-frequency AC isolation between the analog signal line 107 and the test bus 170. However, the selection devices 142 and 144 are insufficient by themselves to provide good isolation from high-frequency AC signals and noise due to the substantial coupling effects caused by the gate-to-source and gate-to-drain overlap capacitances of the selection devices in the non-conducting state. To reduce these coupling effects, the charge-transferring circuit 147 is set to the conducting state, thereby shunting the high-impedance coupling created between the selection devices 142 and 144. In other words, the charge-transferring circuit 147 discharges the charge accumulated in the gate-to-source and gate-to-drain overlap capacitances of the selection devices 142 and 144. Because it is only required to shunt overlap capacitances, the charge-transferring circuit 147 can be made very small. As a result, the amount of additional loading on the signal path between the analog signal line 107 and the test bus 170 produced by the charge-transferring circuit 147 when the switching circuit 140 is enabled is negligible.

The design of the test bus circuit 130 permits the circuit to be physically laid out on an integrated circuit in a variety of configurations. For example, in the switching circuit 140, the selection device 142 and the charge-transferring circuit 147 can be located near the analog circuit 100 while the selection device 144 can be placed near the test bus 170. As a result, the test bus circuit 130 can be used even with designs where the analog circuit 100 is located a significant distance from the test bus 170. The test bus circuit 130 thus provides significant flexibility in the layout and routing of signals, as is often required in integrated circuit designs.

Figure 2:
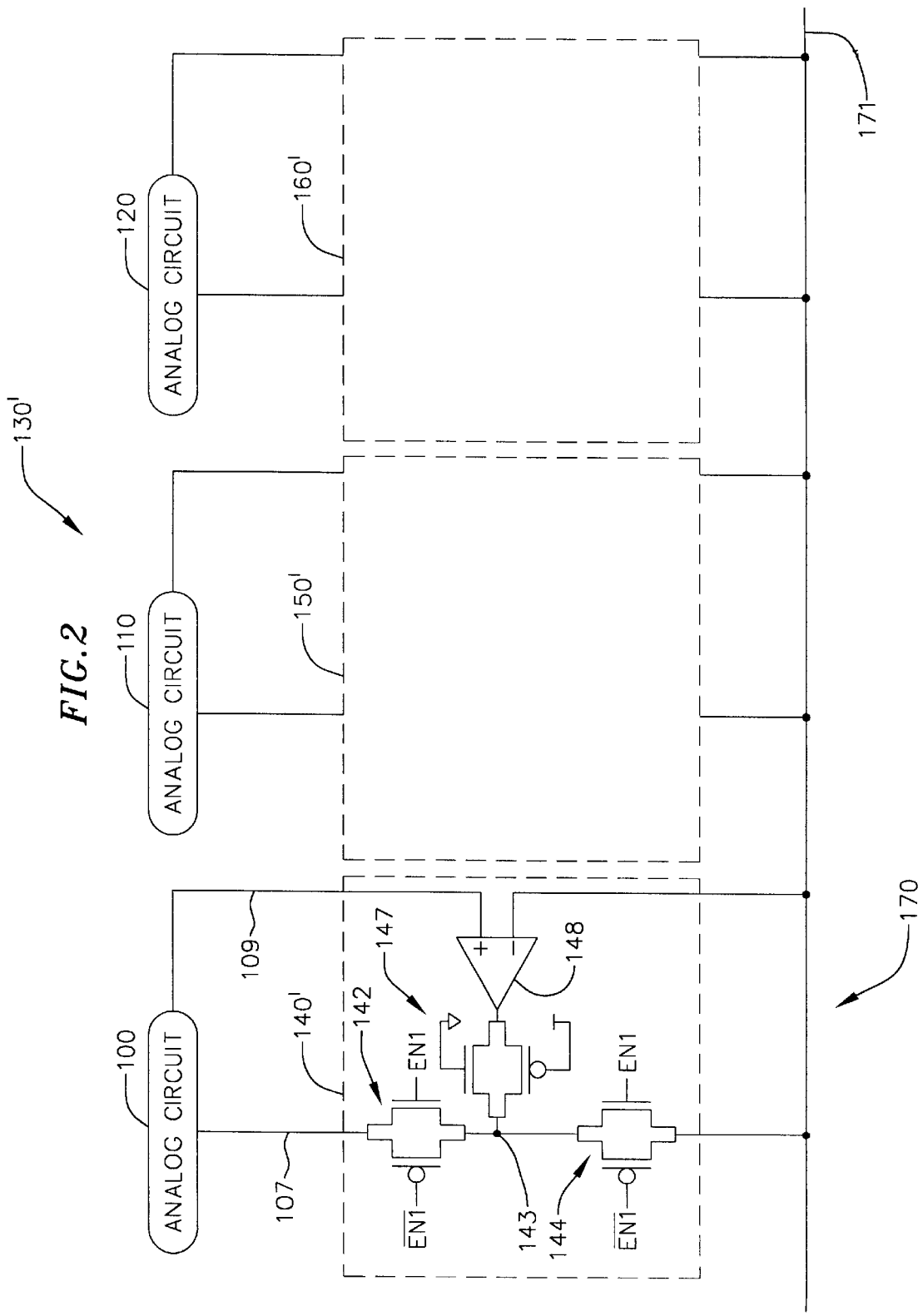
FIG. 2 is a circuit diagram of a test bus circuit in accordance with a second preferred embodiment of the present invention having improved electrical isolation.

FIG. 2 shows a test bus circuit 130' in accordance with a second preferred embodiment of the present invention. The test bus circuit 130' provides an even greater level of electrical isolation between the analog signal line 107 and the test bus 170 than the test bus circuit 130. In this embodiment, one end of the charge-transferring circuit 147 is operatively connected to the output of an inverting buffer 148 rather than to the low-impedance signal line 109. A negative input (−) of the inverting buffer 148 is operatively connected to the test bus conductor 171 of the test bus 170 and a positive input (+) is operatively connected to the low-impedance signal line 109. As mentioned earlier, the signal transmitted by the signal line 109 is generated by a charge source or sink (not shown), such as a low-impedance DC voltage source (e.g., ground) or reference signal source. Thus connected, the buffer 148 inverts the signal on the test bus 170.

The charge-transferring circuit 147 in this embodiment is configured to be always in the off or non-conducting state. In a preferred embodiment, the charge-transferring circuit 147 is a CMOS pass device (as shown in the figure) with the gate terminals of the p- and n-type transistors operatively connected to $V_{DD}$ and GND, respectively. The charge-transferring circuit 147 attenuates the output of the inverting buffer 148 by an amount about equal to that of the selection device 144 when it is off (in fact, the charge-transferring circuit 147 can be a copy of the selection device 144 ). The switching circuit 140' in effect combines a signal with its complement at the node 143 to cancel any undesired signal transmitted from the test bus 170 through the selection device 144. As a result, the switching circuit 140', when disabled, provides nearly complete electrical isolation of the analog signal line 107 from the test bus 170.

Figure 3:
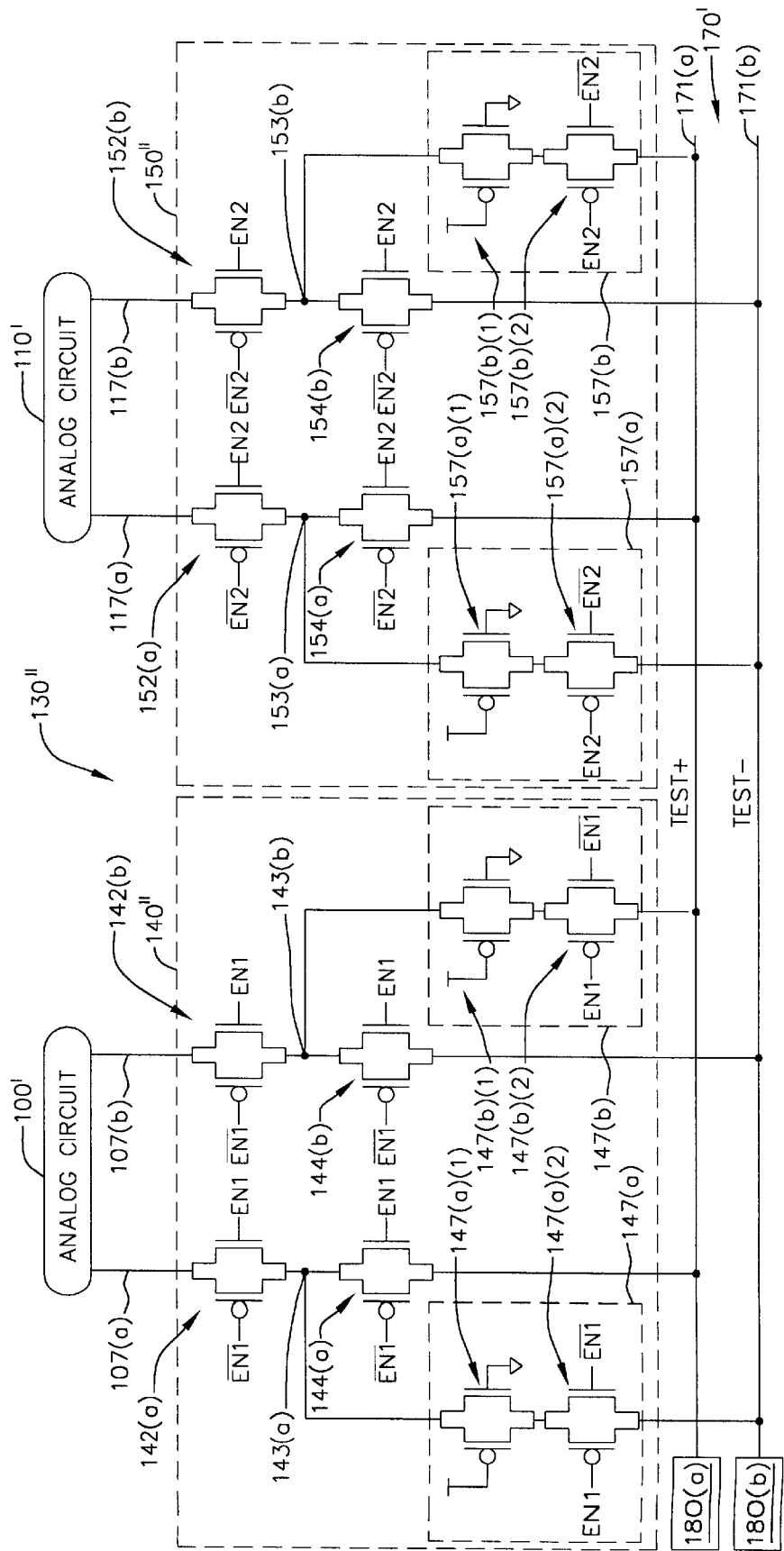
FIG. 3 is a circuit diagram of a test bus circuit in accordance with a third preferred embodiment of the present invention for use with fully differential analog circuits.

FIG. 3 shows a test bus circuit 130" in accordance with a third preferred embodiment of the present invention (showing two switching circuits 140" and 150"). The test bus circuit 130" is intended for use with analog circuits having fully differential signals, which are commonly found in modern analog or mixed-signal integrated circuits. The analog circuits 100" and 110" have two analog signal lines each, 107(a)/107(b) and 117(a)/117(b), respectively, for transmitting the two complementary components of the fully differential signals.

The test bus circuit 130" is similar in most respects to the test bus circuits 130 and/or 130' described earlier except for modifications to accommodate the fully differential signals. The test bus circuit 130" comprises a test bus 170' and one or more switching circuits 140" and 150". The test bus 170' includes a pair of test bus conductors 171(a) and 171(b) that are used to transmit the complementary differential signals TEST+ and TEST−, respectively. The test bus conductors 171(a) and 171(b) are operatively connected to two test bus observe/control points 180(a) and 180(b), which may comprise a pair of integrated circuit package pins.

The switching circuits 140" and 150" are identical in structure and operation and thus will be described using the switching circuit 140" as an example. The switching circuit 140" includes two sets of two or more serially-coupled selection devices 142(a)/144(a) and 142(b)/144(b). The two sets of serially-coupled selection devices 142(a)/144(a) and 142(b)/144(b) selectively connect the respective analog signal lines 107(a) and 107(b) of the analog circuit 100' to the test bus 170'. In a preferred embodiment, the selection devices 142(a), 144(a), 142(b) and 144(b) each comprise a CMOS pass device.

The switching circuit 140" also includes charge-transferring circuits 147(a) and 147(b). Like the charge-transferring circuit 147 of the switching circuit 140' (see FIG. 2), the charge-transferring circuits 147(a) and 147(b) in effect combine a signal with its complement to cancel any noise transmitted from the test bus 170' through the selection devices 144(a) and 144(b). The switching circuit 140", when disabled, thus provides nearly complete electrical isolation of the analog signal lines 107(a) and 107(b) from the test bus 170'. Unlike the switching circuit 140', however, the switching circuit 140" takes advantage of the fact that both the signal TEST+ and its differential complement TEST− are available on the test bus 170' and thus does not need the inverting buffer 148. The charge-transferring circuits 147(a) and 147(b) are operatively connected at one end to the respective nodes 143(a) and 143(b) located between the respective serially-coupled selection devices 142(a)/144(a) and 142(b)/144(b). The other end of the charge-transferring circuits 147(a) and 147(b) is operatively connected to the respective test bus conductors 171(b) and 171(a).

In a preferred embodiment, the charge-transferring circuits 147(a) and 147(b) each comprise two serially-coupled CMOS pass devices 147(a)(1)/147(a)(2) and 147(b)(1)/147(b)(2), respectively, as shown in FIG. 3. Two pass devices rather than one are used to transfer charge to/from the nodes 143(a) and 143(b) to provide increased electrical isolation of the nodes 143(a) and 143(b) from the test bus conductors 171(b) and 171(a), respectively, when the switching circuit 140" is enabled. The gate terminals of the p- and n-type transistors of the CMOS pass devices 147(a)(1) and 147(b)(1) are operatively connected to $V_{DD}$ and GND, respectively, so that the pass devices are always in the off or non-conducting state.

The gate terminals of the p- and n-type transistors in the CMOS pass devices 147(a)(2)/147(b)(2) and 157(a)(2)/157(b)(2) are operatively connected to the control signals EN1/$\overline{EN1}$ and EN2/$\overline{EN2}$, respectively. The control signals EN1/$\overline{EN1}$ and EN2/$\overline{EN2}$ are the same as those used in the test bus circuit 130 of FIG. 1. When the switching circuit 140" is enabled, the CMOS pass devices 147(a)(2) and 147(b)(2) are placed in the non-conducting state to provide increased electrical isolation. When the switching circuit 140' is disabled, the CMOS pass devices 147(a)(2) and 147(b)(2) are placed in the conducting state. In this case, since the charge-transferring circuit 147(a) and the selection device 144(a) both have one CMOS pass device in the non-conducting state, the signals TEST+ and TEST− are attenuated by about the same amount at the node 143(a) so that they cancel each other. Similarly, since the charge-transferring circuit 147(b) and the selection device 144(b) both have one CMOS pass device in the non-conducting state, the signals TEST+ and TEST− are attenuated by about the same amount at the node 143(b) so that they cancel each other. The switching circuit 140' in effect combines a signal with its complement at the nodes 143(a) and 143(b) to cancel any undesired signals transmitted from the test bus 170 through the selection devices 144(a) and 144(b). As a result, the switching circuit 140', when disabled, provides nearly complete electrical isolation of the analog signal lines 107(*a*) and 107(*b*) from the test bus 170'.

Referring back to FIG. 1, in a preferred embodiment the test bus 170 includes the optional shield 172. As is known in the art, the shield 172 forms a Faraday barrier around the test bus conductor 171, thereby electrically isolating the signal transmitted on the test bus conductor 171 from interfering electric fields. The shield 172 at least partially surrounds the test bus conductor 171 between the switching circuits 140, 150 and 160 and the test bus observe/control point 180. The shield 172 permits the test bus 170 to be routed among other potentially interfering signals without degrading the integrity of the signals present on the test bus. A shielded test bus is especially appropriate for integrated circuits that are densely laid out or generate significant electrical noise.

In a preferred embodiment, the shield 172 is implemented as a driven shield in which the shield 172 is driven by a shield amplifier 174. A driven shield 172, in addition to electrically isolating the test bus 170, reduces the capacitive load presented by the test bus to the analog circuits 100, 110 and 120. This is especially advantageous in modern integrated circuits, where the shield 172 usually must be placed very close to the test bus conductor 171 to provide adequate shielding and thus increases the test bus capacitance to unacceptably large levels. A large capacitive load on the test bus 170 is undesirable because it increases the size of the drivers in the analog circuits 100, 110 and 120 required to drive signals onto the test bus 170, thereby increasing the power dissipated, noise generated and area occupied by the analog circuits.

The shield amplifier 174 maintains the shield 172 at a voltage that follows the instantaneous (or alternatively, time-averaged) voltage of the test bus conductor 171 so that the voltage between the test bus conductor 171 and the shield 172 is at all times approximately zero. Because the charge Q of the capacitance C formed between the test bus conductor 171 and the shield 172 is given by the well-known equation Q=C * V, where the voltage V is about zero, the charge Q and thus the current required to drive the test bus 170 is negligible. As a result, the drivers in the analog circuits 100, 110 and 120 do not need to supply any current to drive the test bus 170. In other words, the test bus 170 with the driven shield 172 presents a negligible capacitive load to the analog circuits 100, 110 and 120.

Although the use of a driven shield is not essential to the practice of the invention, there are several advantages to implementing the test bus 170 with the driven shield 172. First, the design of the analog circuits 100, 110 and 120 do not need to be modified for use with the test bus circuit 130 because of the negligible capacitive load presented by the test bus 170. The analog circuits 100, 110 and 120 may use the same low-power circuitry used if the analog circuits were not connected to the test bus circuit. Moreover, the test bus circuit 130 does not increase the power dissipation of the integrated circuit during normal operation because the shield amplifier 174 is turned on only during testing. Second, the propagation of signals through the test bus 170 for observation or control is improved. For the observation function, this is important because in many integrated circuit designs it is either not possible or desirable for the analog circuits to provide a sufficiently low impedance to drive the test bus 170. For the control function, it is important to effectively propagate signals with the test bus 170 because the signals input to the analog circuits 100, 110 or 120 are often of very high-frequency.

The shield amplifier 174 is preferably implemented on the same integrated circuit as the rest of the test bus circuit 130. This arrangement minimizes the number of pins required for the integrated circuit package. Alternatively, the shield amplifier 174 may be placed external to the integrated circuit package with the shield amplifier output signal driven through a shield point 190, which may be a package pin. This arrangement allows the driven shield 172 to extend all the way from test equipment external to the integrated circuit (not shown), through the pin of the integrated circuit package and to the test bus 170. A disadvantage of this embodiment is that an additional pin is required for the shield point 190.

Figure 4:
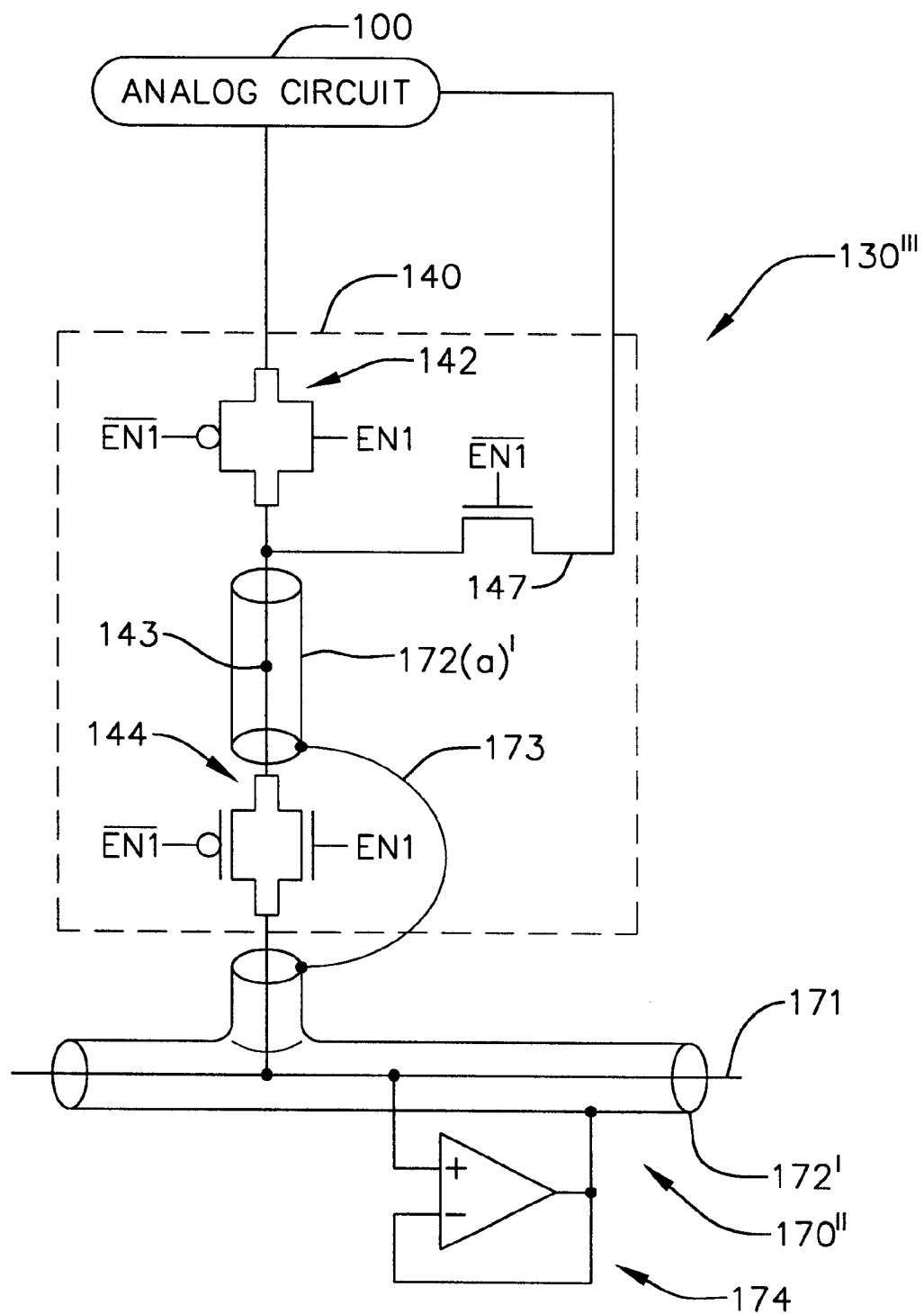
FIG. 4 is a circuit diagram of a test bus circuit in accordance with a fourth preferred embodiment of the present invention including a driven shield that extends to cover an internal portion of the switching circuits.

FIG. 4 shows a fourth preferred embodiment of the test bus circuit 130''' in which the shield 172' extends beyond the test bus 170' to cover an internal portion of the switching circuit 140. The shield 172', which in a preferred embodiment is driven (as shown), includes a shield portion 172(*a*)' that at least partially surrounds the conductor at the node 143 connecting the serially-coupled selection devices 142 and 144. The shield portion 172(*a*)' preferably extends from the selection device 142 all the way to the selection device 144. A shield conductor 173 provides an electrical connection from the main body of the shield 172' to the shield portion 172(*a*)'. The shield 172' provides an improved level of shielding for the test bus circuit 130''' by protecting the conductor at the node 143 from electrical interference. If driven, the shield 172' also reduces the capacitive load presented by the conductor at the node 143 to the analog circuit 100 in the manner described earlier. Consequently, the shield 172' permits the test bus 170'' to be placed a significant distance from the analog circuits 100, 110 and 120 without appreciably increasing the capacitive load presented to the analog circuits, thereby providing increased flexibility in the layout and routing of an integrated circuit.

In summary, the test bus circuit of the present invention provides several advantages. The test bus circuit maintains a high level of signal integrity and bandwidth for signals to be observed or controlled on an analog or mixed-signal integrated circuit. In addition, the test bus circuit minimizes interference with the normal operation of nearby or related circuits on the integrated circuit. As a result, circuits can be individually designed without concern for interference caused by the other circuits or activities occurring on the test bus. The test bus circuit also minimizes the number of pins required, needing only one or two dedicated pins (which may be otherwise unused pins) to directly observe or control signals in multiple circuits. Finally, the test bus circuit is simple and inexpensive to add to a design and does not significantly increase the size or complexity of the circuitry.

While specific embodiments of the invention have been described and illustrated, it will be appreciated that modifications can be made to these embodiments without departing from the spirit of the invention. For example, two or more instances of the test bus circuit 130 can be employed where multiple signals are to be simultaneously observed or controlled in an integrated circuit. Therefore, it is intended that the scope of the invention be defined by the following claims and their equivalents.

What is claimed is:

1. A bi-directional test bus circuit for testing a plurality of circuits, comprising:

a bi-directional test bus; and a plurality of switching circuits, each of the plurality of switching circuits being coupled between the bi-directional test bus and a respective one of the plurality of circuits, each switching circuit including a node in a switching path between the bi-directional test bus and the respective one of the plurality of circuits, wherein the node tends to accumulate charge when the switching circuit is switched on, and wherein the node is substantially electrically uncoupled from the bi-directional test bus and the respective one of the plurality of circuits when the switching circuit is switched off, and wherein the accumulated charge is transferred out of the node, each switching circuit providing an electrical connection between the respective one of the plurality of circuits and the bi-directional test bus when the switching circuit is turned on, and providing a substantial electrical isolation between the respective one of the plurality of circuits and the bi-directional test bus when the switching circuit is turned off.

2. The bi-directional test bus circuit of claim 1, wherein each of the plurality of circuits comprises an analog circuit.

3. The bi-directional test bus circuit of claim 1, wherein each of the plurality of switching circuits includes:

a plurality of serially-coupled devices operatively coupled between the respective one of the plurality of circuits and the bi-directional test bus; and a charge-transferring circuit operatively coupled between the node and a respective charge source or sink, wherein the node is disposed between two of the serially-coupled devices.

4. The bi-directional test bus circuit of claim 3, wherein each of the plurality of switching circuits is configured to be switched on, upon which one or more of the plurality of serially-coupled devices are set to a conducting state by a control signal emanating from a control circuit and the operatively coupled charge-transferring circuit is set to a non-conducting state by the complement of the control signal emanating from the control circuit, and be switched off, upon which one or more of the plurality of serially-coupled devices are set to a non-conducting state by the complement of the control signal and the operatively-coupled charge transferring circuit is set to a conducting state by the control signal.

5. The bi-directional test bus circuit of claim 1, additionally comprising a low-impedance signal line coupled to the node and having an impedance substantially smaller than an impedance of an analog signal line coupling the switching circuit to an analog circuit.

6. The bi-directional test bus circuit of claim 3, wherein the charge-transferring circuit includes a first device operatively fixed in the non-conducting state.

7. The bi-directional test bus circuit of claim 6, wherein for each of the plurality of switching circuits, the first device of the charge-transferring circuit provides a signal attenuation level in a non-conducting state that is substantially equal to a signal attenuation level of one of the devices of the plurality of serially-coupled devices when in a non-conducting state.

8. The bi-directional test bus circuit of claim 6, wherein:

each charge-transferring circuit further includes a second device serially coupled to the first device; and each switching circuit is configured to be switched on, upon which the plurality of serially-coupled devices are set to the conducting state by a control signal emanating from a control circuit and be switched off, upon which the plurality of serially-coupled devices are set to a non-conducting state by the complement of the control signal.

9. The bi-directional test bus circuit of claim 6, further including a second device comprising an inverting buffer having an input operatively coupled to the bi-directional test bus and an output coupled serially to the first device.

10. The bi-directional test bus circuit of claim 1, wherein:

the plurality of circuits comprise a plurality of differential analog circuits, each circuit of the plurality having a first terminal and a second terminal;

the bi-directional test bus further includes a first conductor and a second conductor for transmitting a first signal component and a second signal component of a test signal, in which the first and second signal components are differential complements of each other in which the second signal component is substantially equal in amplitude to the first signal component and substantially one hundred and eighty degrees out of phase with it; and the switching circuit further includes:

a first plurality of differential serially-coupled devices, having each device of the plurality operatively coupled between the first terminal of the respective differential analog circuit and the first conductor of the test bus;

a second plurality of differential serially-coupled devices, having each device of the plurality operatively coupled between the second terminal of the respective differential analog circuit and the second conductor of the test bus;

a first differential charge-transferring circuit operatively coupled between a node disposed within the first plurality of serially-coupled devices and the second conductor of the test bus; and a second differential charge-transferring circuit operatively coupled between a node disposed within the second plurality of serially-coupled devices and the first conductor of the test bus.

11. The bi-directional test bus circuit of claim 1, wherein the bi-directional test bus comprises a shielded conductor.

12. The bi-directional test bus circuit of claim 11, wherein the shield is driven by an amplifier configured to output a voltage substantially equal to a voltage of the test signal transmitted on the test bus;

whereby capacitive loading inherent from the presence of the test bus tends to be reduced.

13. A method for testing a plurality of circuits, comprising the steps of:

providing a bi-directional test bus;

providing a plurality of switching circuits, each of the plurality of switching circuits providing an electrical connection between a respective one of the plurality of circuits and the bi-directional test bus when the switching circuit is switched on, and providing a substantial electrical isolation between the respective one of the plurality of circuits and the bi-directional test bus when the switching circuit is switched off;

providing a plurality of charge sinks coupled to the respective plurality of switching circuits;

setting a selected switching circuit of the respective plurality of switching circuits associated with a selected circuit of the plurality of circuits to a conducting state;

setting the one or more respective switching circuits of the plurality of switching circuits associated with the unselected circuits of the plurality of circuits to a non-conducting state, wherein a node disposed between the respective plurality of circuits and the bi-directional test bus is substantially electrically uncoupled from the respective plurality of circuits and the bi-directional test bus;

transmitting a test signal between the selected circuit of the plurality of circuits and the bi-directional test bus through the selected switching circuit; and transferring an electrical charge from the node within each of the one or more unselected switching circuits of the plurality of switching circuits associated with the unselected circuits of the plurality of charge sinks coupled to the respective plurality of switching circuits.

14. The method for testing a plurality of circuits of claim 13, wherein the test signal of the transmitting step is an analog test signal.

15. The method for testing a plurality of circuits of claim 13, wherein the transferring of an electrical charge from a node disposed within each of a plurality of switching circuits associated with one or more unselected circuits comprises discharging electrical charges stored within the respective switching circuits.

16. The method of claim 13, wherein the step of transferring an electrical charge further comprises the following steps:

attenuating a signal that is formed by inverting the test signal by an amount substantially equal to an attenuation provided by one of the plurality of serially-coupled devices; and transmitting the attenuated, inverted test signal to the node disposed within each of the one or more unselected circuits of the plurality of switching circuits associated with one or more unselected circuits.

17. A method of testing a circuit by selectively coupling a circuit under test to a bi-directional test bus through a switching circuit, comprising:

forming an isolated node internal to the switching circuit coupled between the bi-directional test bus and the circuit under test when the circuit is decoupled from the bi-directional test bus;

removing accumulated charge from the isolated node internal to the switching circuit when the circuit is decoupled from the bi-directional test bus.

18. The method of testing a circuit of claim 17, further comprising shielding the bi-directional test bus.

19. The method of testing a circuit of claim 17, further comprising driving the shield.

20. The method of testing a circuit of claim 17, further comprising coupling a circuit under test to a bi-directional test bus through a switching circuit differentially.

21. A method of testing a circuit by selectively coupling a circuit under test to a bi-directional test bus through a switching circuit, comprising:

forming an isolated node internal to the switching circuit coupled between the bi-directional test bus and the circuit under test when the circuit is decoupled from the bi-directional test bus by deactivating a first selection device;

inverting a signal present on the bi-directional test bus;

attenuating the inverted signal by an amount substantially equal to the isolation of the first selection device; and summing the attenuated and inverted signal at the isolated node such that an undesired signal transmitted from the test bus through the selection device is canceled.

22. The method of testing a circuit of claim 21, further comprising shielding the bi-directional test bus.

23. The method of testing a circuit of claim 22, further comprising driving the shield.

24. A test bus system for selectively effecting connections between multiple circuits under test and a bi-directional test bus observe/control point, comprising:

a substrate;

a bi-directional test bus disposed upon the substrate, the bi-directional test bus observe/control point disposed upon the substrate and coupled to the bi-directional test bus; and a switching circuit for selectively coupling one or more of the multiple circuits under test disposed upon the substrate to the bi-directional test bus observe/control point disposed upon the substrate, wherein the switching circuit includes a node, which is substantially decoupled from the bi-directional test bus and the multiple circuits under test when the switching circuit is switched off.

25. The test bus system of claim 24, wherein the substrate is silicon.

26. The test bus system of claim 24, wherein the bi-directional test bus is shielded.

27. The test bus system of claim 26, wherein the shield is driven.

28. The test bus system of claim 24, wherein the switching circuit further comprises:

a first selection device having a first terminal coupled to the bi-directional test bus and a second terminal coupled to the node;

a second selection device having a first terminal coupled to one of the multiple circuits under test and a second terminal coupled to the node; and a charge transferring device having a first terminal coupled to the node and a second terminal coupled to a charge source.

29. The test bus system of claim 28, wherein the second terminal of the charge transferring device is coupled to a charge sink.

30. The test bus system of claim 28, wherein the first selection device includes a CMOS pass device.

31. The test bus system of claim 28, wherein the second selection device includes a CMOS pass device having a drain coupled to the first terminal a source coupled to the second terminal and a gate coupled to a control signal.

32. The test bus system of claim 28, wherein the charge transferring device includes a CMOS pass device having a drain coupled to the first terminal a source coupled to the second terminal and a gate coupled to a control signal.

33. The test bus system of claim 28, wherein the charge transferring device includes a plurality of series coupled transistors coupled from the node to the charge source.

34. The test bus system of claim 28, wherein the charge transferring device includes a p-type transistor having a drain coupled to the first terminal a source coupled to the second terminal and a gate coupled to a control signal.

35. The test bus system of claim 28, wherein the charge transferring device includes an n-type transistor having a drain coupled to the first terminal a source coupled to the second terminal and a gate coupled to a control signal.

36. The test bus system of claim 24, wherein the switching circuit includes:

a first selection device having a first terminal coupled to the bi-directional test bus and a second terminal coupled to a node;

a second selection device having a first terminal coupled to one of the multiple circuits under test and a second terminal coupled to the node;

a charge transferring device having a first terminal coupled to the node; and an inverter having a negative input coupled to the bi-directional test bus, a positive input coupled to a charge sink, and having an output coupled to the second terminal of the charge transferring device.

37. The test bus system of claim 36, wherein the positive input of the inverter is coupled to a charges ink.

38. A high isolation switch comprising:
   a first selection device having a first terminal coupled to a bi-directional test bus and a second terminal coupled to a node;
   a second selection device having a first terminal coupled to one of multiple circuits under test and a second terminal coupled to the node; and
   a charge transferring device having a first terminal coupled to the node.

39. The high isolation switch of claim 38, wherein the second terminal of the charge transferring device is coupled to charge sink.

40. The high isolation switch of claim 38, wherein the first selection device comprises a CMOS pass device.

41. The high isolation switch of claim 38, wherein the second selection device includes a CMOS pass device having a drain coupled to the first terminal a source coupled to the second terminal and a gate coupled to a control signal.

42. The high isolation switch of claim 38, wherein the charge transferring device includes a CMOS pass device having a drain coupled to the first terminal a source coupled to the second terminal and a gate coupled to a control signal.

43. The high isolation high of claim 38, wherein the charge transferring device includes a plurality of series coupled transistors coupled from the node to the charge source.

44. The high isolation switch of claim 38, wherein the charge transferring device includes a p-type transistor having a drain coupled to the first terminal a source coupled to the second terminal and a gate coupled to a control signal.

45. The high isolation switch of claim 38, wherein the charge transferring device includes a n-type transistor having a drain coupled to the first terminal a source coupled to the second terminal and a gate coupled to a control signal.

46. The high isolation switch of claim 38, wherein the first selection device, the second selection device and the charge transferring device are mounted on a substrate.

47. The high isolation switch of claim 46, wherein the substrate is silicon.

48. A method for setting a switching circuit with first and second terminals to a non-conducting state, comprising the steps of:
   switching open a first selection device connected between the first terminal and a node in the switching circuit;
   switching open a second selection device connected between the node in the switching circuit and the second terminal; and
   switching closed a third selection device connected between the node in the switching circuit and a charge source.

49. A method for setting a switching circuit with first and second terminals to a non-conducting state, comprising the steps of:
   switching open a first selection device connected between the first terminal and a node in the switching circuit;
   switching open a second selection device connected between the node in the switching circuit and the second terminal; and
   switching closed a third selection device connected between the node in the switching circuit and a charge sink.

50. The method of claim 49, wherein switching closed the third selection device connected to a grounded charge sink discharges the electrical charge accumulated in the switching circuit.

51. A method for selectively isolating a connection from a circuit to a test bus via a switching circuit, comprising:
   switching open a first selection device connected between the circuit and a node in the switching circuit;
   switching open a second selection device connected between the node in the switching circuit and the test bus; and
   switching closed a third selection device connected between the circuit node and a charge source.

52. A method for selectively isolating a connection from a circuit to a test bus via a switching circuit, comprising:
   switching open a first selection device connected between the circuit and a node in the switching circuit;
   switching open a second selection device connected between the node in the switching circuit and the test bus; and
   switching closed a third selection device connected between the circuit node and a charge sink.

53. The method of claim 52, wherein switching closed a third selection device connected to a grounded charge sink discharges the electrical charge accumulated in the test bus.

54. A method for selectively isolating a connection from a circuit to a test bus via a switching circuit, comprising the steps of:
   switching open a first selection device connected between the circuit and a node in the switching circuit,
   switching open a second selection device connected between the node in the switching circuit and the test bus,
   complementing the test bus signal, and
   sending the complemented test bus signal through a third selection device to the node in the switching circuit.

* * * * *

UNITED STATES PATENT AND TRADEMARK OFFICE
CERTIFICATE OF CORRECTION

PATENT NO. : 6,316,933 B1
DATED : November 13, 2001
INVENTOR(S) : Erlend Olson

It is certified that error appears in the above-identified patent and that said Letters Patent is hereby corrected as shown below:

Column 15,
Line 4, replace "charges ink" with -- charge sink --.
Line 17, before "charge sink" insert -- a --.
Line 28, replace "high isolation high" with -- high isolation switch --.
Line 37, replace "a n-type" with -- an n-type --.

Column 16,
Line 17, replace "discharges" with -- thereby discharging --.
Line 39, replace "discharges" with -- thereby discharging --.

Signed and Sealed this

Eighteenth Day of February, 2003

JAMES E. ROGAN
*Director of the United States Patent and Trademark Office*